(12) United States Patent
Katsuta

(10) Patent No.: US 10,376,915 B2
(45) Date of Patent: Aug. 13, 2019

(54) IMPRINT APPARATUS AND METHOD OF CONTROLLING THE SAME

(71) Applicant: CANON KABUSHIKI KAISHA, Tokyo (JP)

(72) Inventor: Ken Katsuta, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/964,548

(22) Filed: Apr. 27, 2018

(65) Prior Publication Data

US 2018/0318868 A1 Nov. 8, 2018

(30) Foreign Application Priority Data

May 8, 2017 (JP) .................................. 2017-092563

(51) Int. Cl.
| | |
|---|---|
| *B05C 11/10* | (2006.01) |
| *B41J 2/015* | (2006.01) |
| *B81C 1/00* | (2006.01) |
| *B05D 1/26* | (2006.01) |
| *B41J 2/045* | (2006.01) |

(52) U.S. Cl.
CPC ................ *B05C 11/10* (2013.01); *B05D 1/26* (2013.01); *B41J 2/015* (2013.01); *B41J 2/0456* (2013.01); *B41J 2/04508* (2013.01); *B41J 2/04581* (2013.01); *B81C 1/00436* (2013.01); *B81C 2201/0153* (2013.01)

(58) Field of Classification Search
CPC ...... B41J 2/015; B41J 2/04508; B41J 2/0456; B41J 2/04581; B05C 11/10
See application file for complete search history.

(56) References Cited

U.S. PATENT DOCUMENTS 9,004,633 B2 * 4/2015 Yanagisawa ......... B41J 2/04525
347/10

FOREIGN PATENT DOCUMENTS

JP 2009-183859 A 8/2009

OTHER PUBLICATIONS

Namba et al., U.S. Appl. No. 15/964,528, filed Apr. 27, 2018.

* cited by examiner

*Primary Examiner* — Lamson D Nguyen
(74) *Attorney, Agent, or Firm* — Venable LLP

(57) ABSTRACT

An imprint apparatus, comprises: a discharge unit that discharges a liquid onto a substrate; a storage unit that stores a plurality of discharge conditions for the discharge unit; and a control unit that controls the discharge unit based on a discharge condition that is stored in the storage unit, wherein the control unit selects the discharge condition from the plurality of discharge conditions in accordance with a discharge spacing for discharging the liquid.

10 Claims, 4 Drawing Sheets

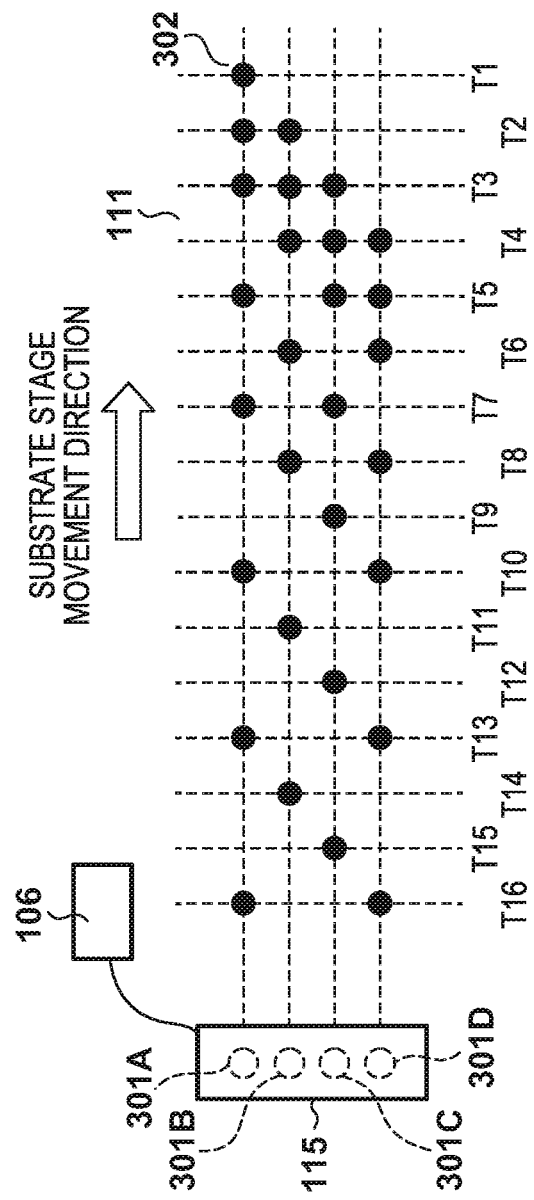

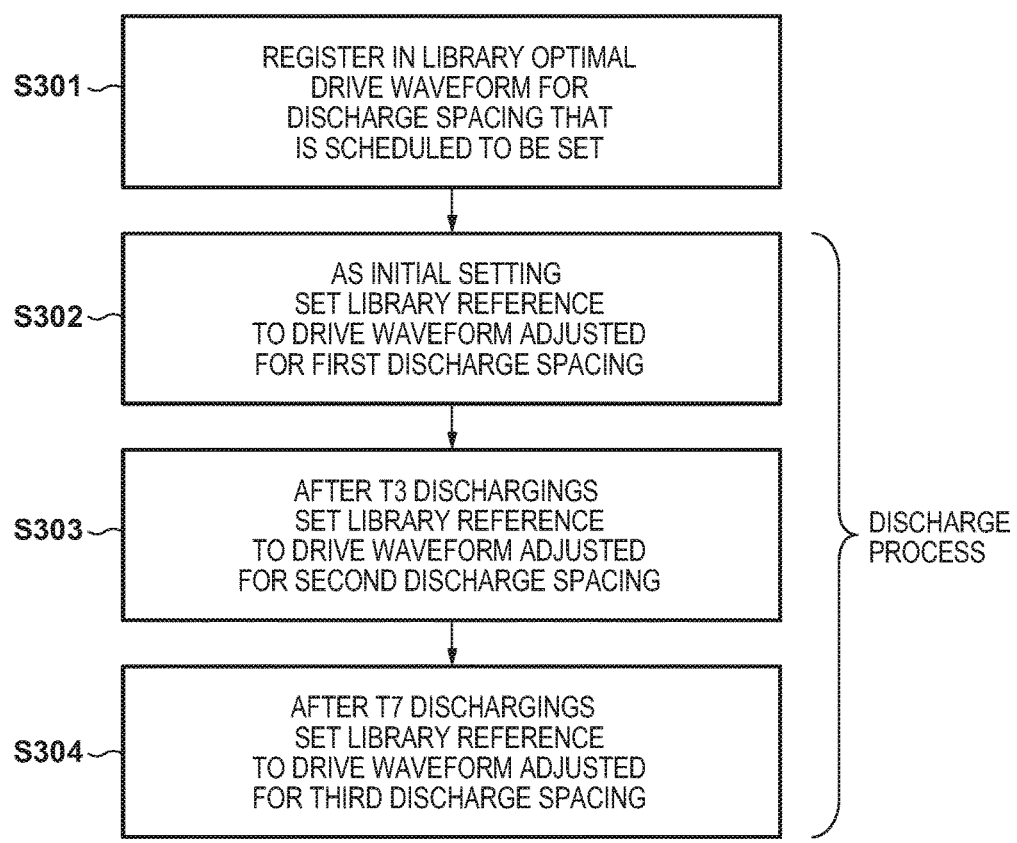

IMPRINT APPARATUS AND METHOD OF CONTROLLING THE SAME

BACKGROUND OF THE INVENTION

Field of the Invention

The present invention relates to an imprint apparatus and a method of controlling the same.

Description of the Related Art

To support miniaturization in semiconductor devices, MEMS (Micro Electro Mechanical Systems), or the like, in addition to a conventional photolithographic technique, there is a micropatterning process technique for molding uncured resin on a substrate by a mold to form a resin pattern on the substrate. This technique is also referred to as an imprinting technique, and can form a fine structure of an order of nanometers on a substrate.

For example, a photocuring method is one imprinting technique. In a dispenser in an imprint apparatus that employs the foregoing technique, high precision is required in a discharge amount or discharge speed for coating resin with respect to a substrate. Note that a deviation in discharge speed leads to a deviation of a position where the resin attaches to the substrate. When the discharge position or the discharge amount deviates, uneven thickness will be made in the resin that is coated in a shot, and there is a possibility that a filling property of the resin with respect to a mold will deteriorate so that a defect will occur in the resin pattern.

Remaining vibration, which is where vibration from a previous discharge or vibration that a neighboring nozzle causes to occur due to a discharge operation, that remains in a meniscus or a cavity is one cause for precision of the discharge speed and discharge amount to deteriorate. Japanese Patent Laid-Open No. 2009-183859 describes a method for correcting variation of a discharge amount by causing a discharge pattern to change.

The discharge amount and discharge speed which are discharge capabilities of a dispenser are measured by using a dedicated measurement device before installation in an imprint apparatus, and a drive waveform that is applied to a piezoelectric element is adjusted so that the discharge amount and discharge speed become appropriate numerical values. However, after installation to the imprint apparatus, there is a necessity to perform a discharge operation while changing a discharge spacing of a nozzle within one shot in order to support a drop recipe. For example, there is a necessity to increase discharge density in the drop recipe for the outside of a pattern in comparison to the inside of the pattern because the outside of the pattern is likely to come into contact with outside air at a time of an imprint and thus have a tendency to dry. When the discharge spacing of a nozzle gets shorter, the influence of remaining vibration of discharge in a nozzle unit before the change remains strong, and values of the discharge speed and discharge amount change in comparison to their values before the change. Accordingly, causing the discharge spacing to change without causing the discharge amount and discharge speed to change is required.

Japanese Patent Laid-Open No. 2009-183859 provides a means for correcting discharge amounts in a plurality of nozzle groups in order to suppress the influence of remaining vibration. However, in a case of seeking high precision, it is difficult to increase the precision in comparison to a case of making an adjustment with respect to each nozzle.

Furthermore, in an imprint apparatus where a substrate stage operates, precision for discharge speed as well as discharge amount is required, and there are a plurality of timings for switching the discharge spacing in one shot, that is in one scan. Because a short coating time in a scan is required so as to not lower throughput, fast switching is desirable. In a case of using the method of Japanese Patent Laid-Open No. 2009-183859 in correction of a discharge amount, a number of switches will be large in a case of changing the discharge pattern in a scan.

SUMMARY OF THE INVENTION

In the invention of the present application, it is possible to suppress deviation of a discharge speed and a discharge amount that occurs due to change of a discharge spacing after installation of a dispenser into an imprint apparatus.

According to one aspect of the present invention, there is provide an imprint apparatus, comprising: a discharge unit configured to discharge a liquid onto a substrate; a storage unit configured to store a plurality of discharge conditions for the discharge unit; and a control unit configured to control the discharge unit based on a discharge condition that is stored in the storage unit, wherein the control unit selects the discharge condition from the plurality of discharge conditions in accordance with a discharge spacing for discharging the liquid.

According to another aspect of the present invention, there is provide a method of controlling an imprint apparatus provided with a discharge unit configured to discharge resin onto a substrate and a storage unit configured to store a plurality of discharge conditions for the discharge unit, the method comprising: selecting a discharge condition from the plurality of discharge conditions in accordance with a discharge spacing for discharging a liquid, when forming a pattern on the substrate.

By the present invention, in an imprint apparatus, it is possible to maintain precision of a discharge speed and a discharge amount even if a change of a discharge spacing occurs.

Further features of the present invention will become apparent from the following description of exemplary embodiments (with reference to the attached drawings).

BRIEF DESCRIPTION OF THE DRAWINGS

FIGS. 3A and 3B are views for describing control for switching a drive waveform according to the present invention.

DESCRIPTION OF THE EMBODIMENTS

With references to the drawings or the like, description is given below regarding an embodiment for implementing the present invention. Note that configurations or the like indicated below are examples, and there is no limitation to them.

[Apparatus Configuration]

Description is given regarding an example of a configuration of an imprint apparatus according to an embodiment of the present invention.

Figure 1:
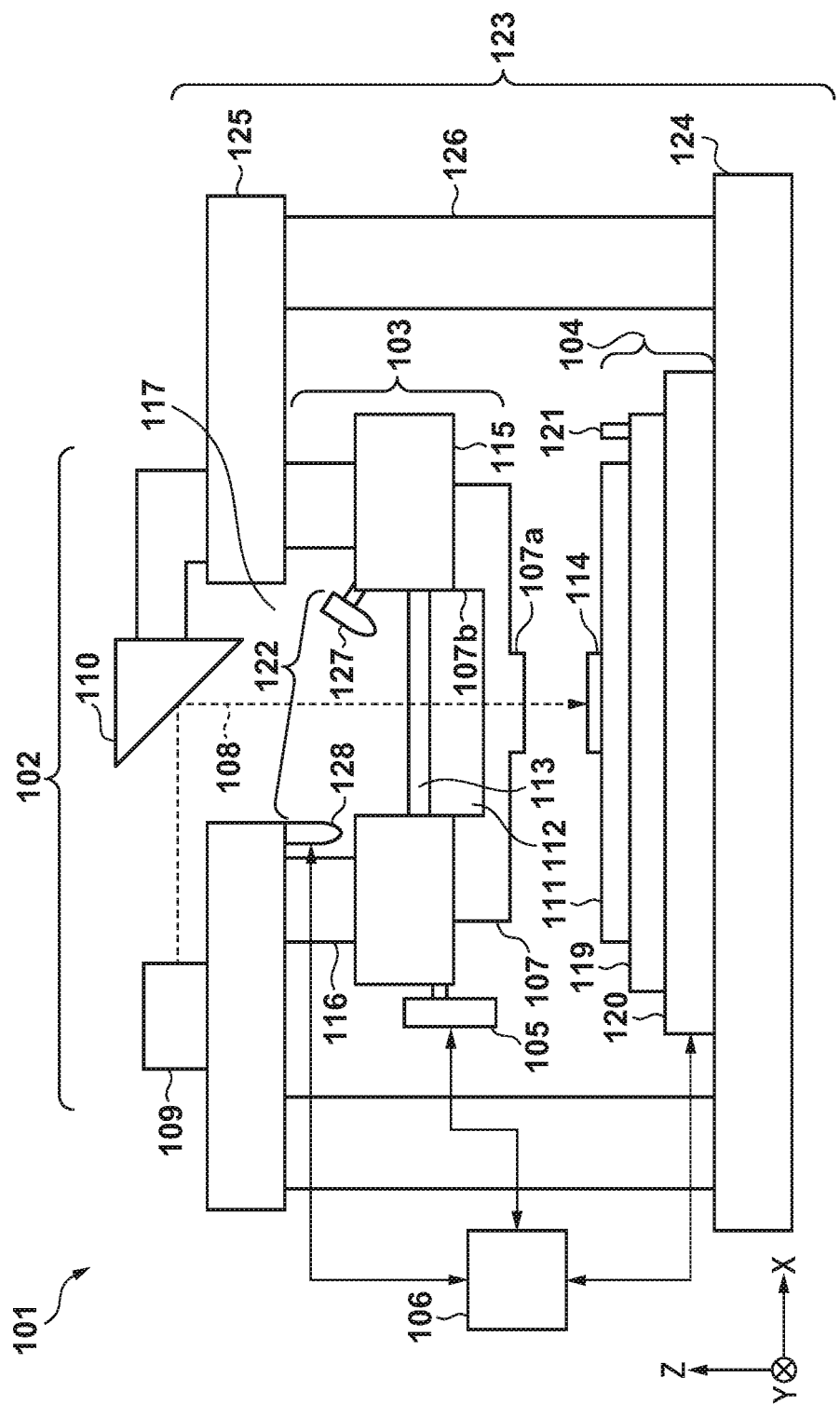
FIG. 1 is a view for illustrating an example of an overall configuration of an imprint apparatus according to the present invention.

FIG. 1 is a schematic view for illustrating an example of a configuration of an imprint apparatus 101 according to the invention of the present application. The imprint apparatus 101 is used in the manufacturing of a device such as a semiconductor device as an article, and is an apparatus for molding, by a mold, uncured resin (a liquid) that is coated on a substrate 111 which is a target of processing to form a resin pattern on the substrate 111. Note that description is given here by using an imprint apparatus that employs a photocuring method, but application is also possible to an imprint apparatus that uses another technique, for example to an imprint apparatus that uses a thermal nanoimprint technique. In addition, in views below, a Z-axis is taken parallel to an optical axis of an illumination system for irradiating an ultraviolet light with respect to resin on the substrate 111, and an X axis and a Y axis that are orthogonal to one another are taken in a plane that is orthogonal to the Z-axis.

The imprint apparatus 101 is provided with a light irradiation unit 102, a mold holding mechanism 103, a substrate stage 104, a discharge unit 105, a control unit 106, a measurement unit 122, and a housing 123.

The light irradiation unit 102 irradiates an ultraviolet light 108 with respect to a mold 107 at the time of imprint processing. In FIG. 1, a path of the ultraviolet light 108 is illustrated by a dashed line arrow symbol. The light irradiation unit 102 is configured by including a light source 109 and an optical element 110 for correcting the ultraviolet light 108 irradiated from the light source 109 to be light that is appropriate for an imprint. Note that, in the present embodiment, the light irradiation unit 102 is installed in order to use the photocuring method, but in a case of using a heat-curing method, for example, a heat source unit for causing a thermosetting resin to cure would be installed in place of the light irradiation unit 102.

The mold 107 has an outer circumferential shape of a rectangle, and includes a pattern portion 107a where a concave-convex pattern for a circuit pattern or the like that is to be transferred is formed in a three-dimensional form on a surface that corresponds to the substrate 111. In addition, the material of the mold 107 is a material through which the ultraviolet light 108 can penetrate, such as quartz. Furthermore, the mold 107 may be a shape that has a concave-shaped cavity 107b for making it easy to deform the mold 107 on a surface where the ultraviolet light 108 is irradiated. The cavity 107b has a circular planar shape, and its depth is appropriately set in accordance with the size or material of the mold 107.

In addition, configuration may be taken to install on an opening region 117, in the mold holding mechanism 103, a light transmitting member 113 that takes a space 112 surrounded by a part of the opening region 117 and the cavity 107b as an enclosed space, and control pressure in the space 112 in accordance with a pressure correction apparatus (not shown). For example, when pressing the mold 107 and a resin 114 on the substrate 111, the pressure in the space 112 is set higher than outside by the pressure correction apparatus. Consequently, the pattern portion 107a bends to a convex shape toward the substrate 111, and contacts the resin 114 starting from a central portion of the pattern portion 107a. With this, it is possible to suppress gas (air) being trapped between the pattern portion 107a and the resin 114, and cause the resin 114 to fill all of the concave-convex portion of the pattern portion 107a.

The mold holding mechanism 103 is configured by including a mold chuck 115 and a mold driving mechanism 116. The mold chuck 115 pulls and holds the mold 107 by a vacuum suction force or electrostatic force. The mold driving mechanism 116 holds the mold chuck 115, and causes the mold 107 held in the mold chuck 115 to move. The mold chuck 115 and the mold driving mechanism 116 have the opening region 117 in central portions thereof so that the ultraviolet light 108 irradiated from the light source 109 of the light irradiation unit 102 is irradiated toward the substrate 111.

The mold driving mechanism 116 causes the mold 107 to move in a Z-axis direction so as to selectively release or press the mold 107 and the resin 114 on the substrate 111. For example, a linear motor or an air cylinder is present as an actuator that can be employed in the mold driving mechanism 116. In addition, the mold driving mechanism 116 may be configured from a plurality of driving systems, such as a coarse motion driving system and a fine motion driving system, in order to support high precision positioning of the mold 107. Furthermore, configuration may be taken such that the mold driving mechanism 116 has, for example, a tilt function for correcting inclination of the mold 107, or a position correction function in an X-axis direction, a Y-axis direction, or a θ direction that is a rotation around the Z-axis, in addition to that in the Z-axis direction.

Note that a press operation and a release operation in the imprint apparatus 101 may be realized by causing the mold 107 to move in a Z-axis direction as described above, and may be realized by causing the substrate stage 104 to move in a Z-axis direction. In addition, configuration may be taken such that both of these are caused to move relative to each other.

The substrate 111 is, for example, a single crystal silicon substrate or an SOI (Silicon On Insulator) substrate, and the resin 114 that is to be molded by the pattern portion 107a formed on the mold 107 and then subject to ultraviolet light curing is coated on a processing target surface of the substrate 111.

The substrate stage 104 holds the substrate 111, and when the mold 107 and the resin 114 on the substrate 111 are pressed, performs alignment of the mold 107 and the resin 114. The substrate stage 104 is configured by including a substrate chuck 119, a substrate stage driving unit 120, and a stage reference mark 121. The substrate chuck 119 holds the substrate 111 by a vacuum chuck. The substrate stage driving unit 120 holds the substrate chuck 119 by a mechanical means, and can move in the X-Y plane based on control by the control unit 106.

The substrate stage driving unit 120 can employ a linear motor, for example, as an actuator. The substrate stage driving unit 120 may be configured from a plurality of driving systems, such as a coarse motion driving system and a fine motion driving system, with respect to each direction of the X axis and the Y axis. Furthermore, configuration may be taken such that the substrate stage driving unit 120 has a driving system for position correction in a Z-axis direction, a position correction function for a θ direction of the substrate 111, a tilt function for correcting inclination of the substrate 111, or the like. The stage reference mark 121 is used when aligning the mold 107 on the surface of the substrate chuck 119.

The discharge unit 105 discharges uncured resin 114 in a liquid state (resist liquid) from nozzles to apply it onto the substrate 111. In the present embodiment, the discharge unit 105 has a method for using the piezoelectric effect of a piezoelectric element to push the resin 114 out from the nozzles. The control unit 106 generates a drive waveform for driving the piezoelectric element, and drives the piezoelectric element so as to deform it to a shape suitable for discharging. The discharge unit 105 is provided with a plurality of nozzles, and each is configured so as to be controllable independently. The resin 114 is a light-curable resin that has the property of curing in accordance with receiving the ultraviolet light 108, and is appropriately selected in accordance with various conditions such as a semiconductor device manufacturing process. In addition, the amount of the resin 114 discharged from the nozzles of the discharge unit 105 and a desired thickness of the resin 114 that is formed on the substrate 111 are appropriately decided in accordance with the density of the pattern to be formed, for example.

For the measurement unit 122, an alignment measurement device 127 and a measurement device for observation 128 are present as representative measurement devices. The alignment measurement device 127 measures displacement in each direction of the X axis and the Y axis between an alignment mark formed on the substrate 111 and an alignment mark formed on the mold 107. The measurement device for observation 128 is an image capturing apparatus such as a CCD (Charge Coupled Device) camera, for example, and obtains as image information a pattern of the resin 114 that is discharged onto the substrate 111.

The control unit 106 controls, for example, operation and correction of each configuration element of the imprint apparatus 101. The control unit 106 is configured by a computer or the like, is connected via communication channels to each configuration element of the imprint apparatus 101, and executes control of each configuration element in accordance with data and various programs stored in a storage unit or the like, for example. The control unit 106 of the present embodiment controls operation of the mold holding mechanism 103, the substrate stage 104, and the discharge unit 105 based on the measurement information of the measurement unit 122. Note that the control unit 106 may be configured integrally with other portions of the imprint apparatus 101, and may be configured separately from other portions of the imprint apparatus 101. In addition the control unit 106 may be configured by a plurality of computers instead of one computer.

The housing 123 is provided with a base plate 124 on which the substrate stage 104 is mounted, a bridge plate 125 for fixing the mold holding mechanism 103, and a column 126 that extends from the base plate 124 and is for supporting the bridge plate 125. Furthermore, although this is not illustrated in FIG. 1, the imprint apparatus 101 is provided with a mold conveyance mechanism for conveying the mold 107 from outside of the apparatus to the mold holding mechanism 103, and a substrate conveying mechanism for conveying the substrate 111 from outside of the apparatus to the substrate stage 104.

[Imprint Processing]

Next, explanation is given regarding imprint processing by the imprint apparatus 101 according to the present embodiment.

The control unit 106 loads and fixes the substrate 111 to the substrate chuck 119 on the substrate stage 104 by the substrate conveying mechanism (not shown), and moves the substrate stage 104 to a position at which the discharge unit 105 discharges. Next, as a coating process, the discharge unit 105 discharges and coats the resin 114 onto a pattern formation region which is a predetermined processing target region of the substrate 111, based on the drive waveform generated by the control unit 106.

Next, the control unit 106 moves the substrate stage 104 so that the pattern formation region on the substrate 111 is positioned directly below the pattern portion 107a formed in the mold 107. Next, as a pressing process, the control unit 106 drives the mold driving mechanism 116 to press the mold 107 onto the resin 114 on the substrate 111. By this pressing process, the resin 114 fills the concave-convex portion of the pattern portion 107a. In this state, as a curing process, the control unit 106 causes the light irradiation unit 102 to irradiate the ultraviolet light 108 from a top surface of the mold 107, and the ultraviolet light 108 that penetrates the mold 107 causes the resin 114 to cure. As a releasing step, after the resin 114 cures, the control unit 106 drives the mold driving mechanism 116 again to release the mold 107 from the resin 114.

By the above series of operations, the pattern of the resin 114 which is a three-dimensional shape that conforms with the concave-convex portion of the pattern portion 107a is molded on the surface of the pattern formation region on the substrate 111. By performing such a series of imprint operations a plurality of times while changing the pattern formation region in accordance with driving of the substrate stage 104, it is possible to mold a plurality of patterns of the resin 114 on one substrate 111.

[Fluctuation of the Discharge Speed and the Discharge Amount]

Figure 2A:
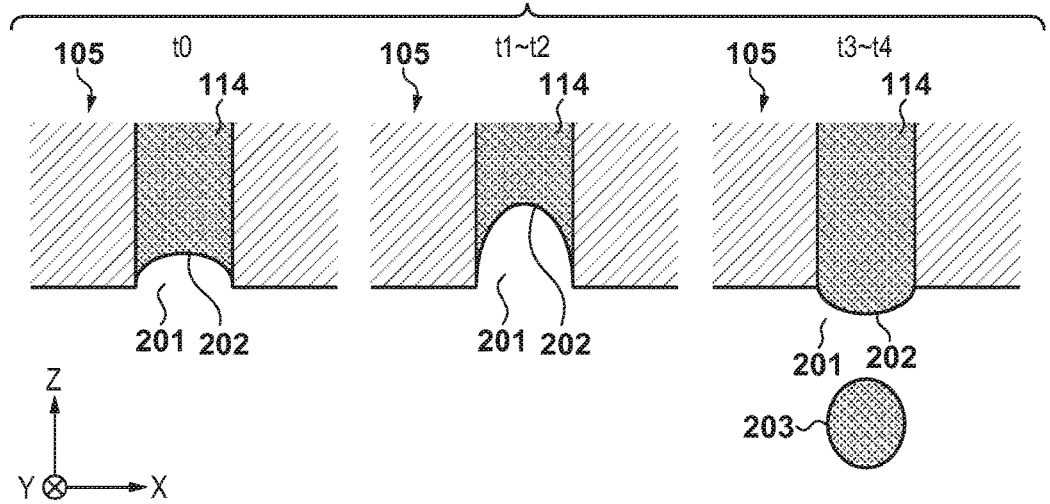
FIGS. 2A and 2B are views for describing causes for fluctuation of a discharge speed and a discharge amount that the present invention resolves.
Figure 2B:
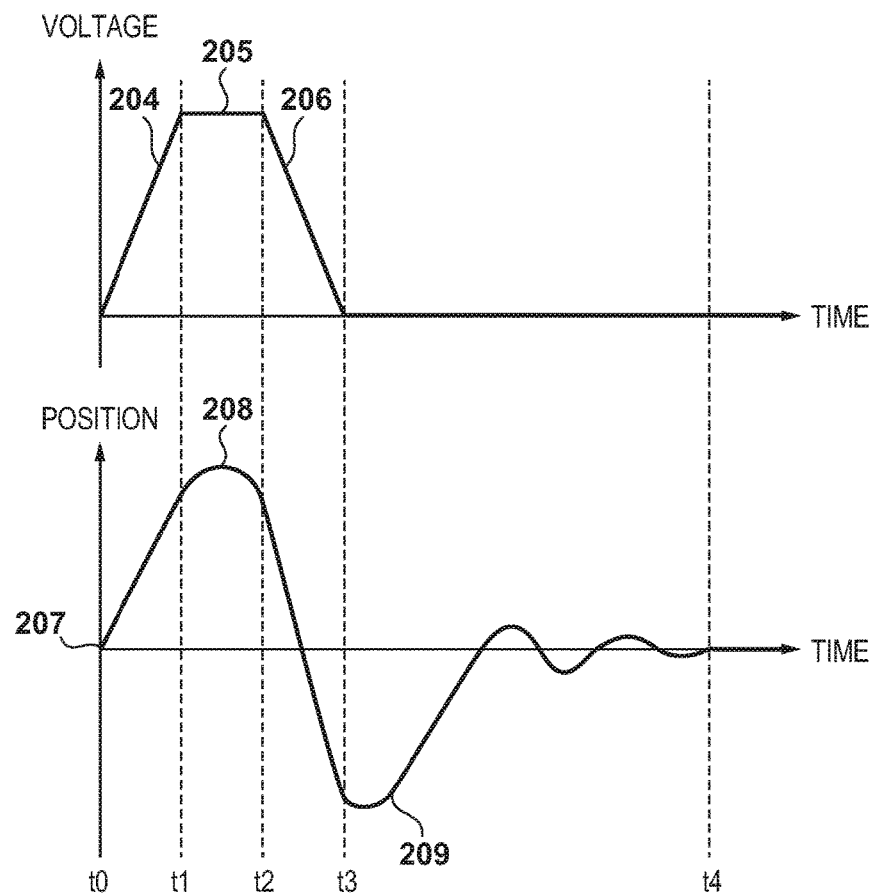

Next, using FIGS. 2A and 2B, description is given for a reason why the discharge speed and the discharge amount fluctuate at a time when the discharge spacing changes.

FIG. 2A illustrates an X-Z cross-section of a nozzle 201 provided in the discharge unit 105. Here, an illustration of discharge of the resin 114 by the discharge unit 105 is given. Directions of coordinates illustrated in FIG. 2A comply with FIG. 1. Illustration is such that a boundary between the resin 114 and outside air is given as a liquid surface 202, and the resin that is discharged is given as a droplet 203.

The graph on the top side of FIG. 2B indicates a drive waveform that is a signal of a voltage value provided to a piezoelectric element provided in the discharge unit 105. The abscissa indicates time and the ordinate indicates voltage. Description is given here by using a trapezoidal wave, which is the most fundamental drive waveform, as the drive waveform. The trapezoidal wave is primarily divided into three components, and is configured from a pull component 204, a standby component 205, and a push component 206. For the trapezoidal wave used in this description, the voltage is caused to change at three divided periods from t0 to t3. The pull component 204 is from t0 to t1, the standby component 205 is from t1 to t2, and the push component 206 is from t2 to t3.

The graph on the bottom side of FIG. 2B illustrates the position of the liquid surface 202 of the resin 114 in the nozzle 201. The abscissa indicates time, and the ordinate indicates the position of the liquid surface 202 in the nozzle. Times t1 through t4 correspond to those illustrated in FIG. 2A. The liquid surface 202 is initially at the position of a reference position 207. At a time of discharge, the liquid surface 202 reaches a pulling position 208 by first being pulled inside in a +Z direction, and then is pushed to a pushing location 209 in the −Z direction. Because the droplet 203 is formed by the time the pushing location 209 is reached, although there are actually times where the position of the liquid surface is more on the −Z direction side in comparison to the graph, in order to simplify the description, a representative position of the liquid surface 202 is illustrated with no illustration given for effects of the droplet 203 on the position of the liquid surface 202. In addition, although the liquid surface 202 actually moves delayed with respect to times for voltages applied to the piezoelectric element, in the present embodiment description is given by omitting such a delay component.

The trapezoidal wave pulls the liquid surface 202 in the +Z direction to the reference position 207 by the initial pull component 204. This is to perform a discharge by efficiently using the force whereby the liquid surface 202 that was first pulled goes to return to its original position. After the pull component 204, the voltage is maintained at a constant by the standby component 205. Here, the liquid surface 202 starts to move in the −Z direction after reaching the pulling position 208 which is the position to which it was first pulled in the +Z direction. Here, by pushing the liquid surface 202 in the −Z direction all at once by the push component 206, the resin 114 from the nozzle 201 forms a liquid column outside of the nozzle 201, and subsequently the droplet 203 is formed due to the surface tension of the liquid column. Subsequently, the liquid surface 202 returns to the position for the reference position 207 by t4, while repeatedly vibrating in the −Z direction and converging. After a series of steps for discharging the droplet 203, the droplet 203 is consecutively formed again through similar steps.

Here, an amount of time for the liquid surface 202 to return to the reference position 207 between t3 and t4 has a long-term component that is not illustrated in addition to a short-term component that is illustrated here, and is decided by complex factors. When the next drive waveform is inputted during t3 to t4, this means that the next discharge operation is transitioned to before the liquid surface 202 returns to the reference position 207. When the discharge spacing is long, the influence of the return is absent or small enough that it can be ignored, but when the discharge spacing is short, this means that a subsequent discharge is performed in a state where this influence remains. Because this influence causes the discharge speed and the discharge amount of the droplet 203 to fluctuate, a difference between a time where an adjustment has been made appears as fluctuation of the discharge speed and the discharge amount.

In the present embodiment, consideration is given to such fluctuation, and a plurality of drive waveforms for correcting the discharge speed and the discharge amount to appropriate values are adjusted for each nozzle in advance of a discharge process and stored in a library (a storage unit: not shown). For each nozzle, an appropriate drive waveform is selected from the plurality of drive waveforms stored in the library and used so that the discharge speed and the discharge amount in accordance with the discharge spacing in a discharge process are maintained as constant. In other words, a drive waveform to use as a discharge condition for a nozzle is selected from the plurality of drive waveforms stored in the library.

[Drive Waveform Switching]

Using FIGS. 3A and 3B, description is given for a process for switching a drive waveform according to the present embodiment in order to suppress fluctuation of discharge speed and discharge amount due to discharge spacing. FIG. 3A indicates an illustration where coating of a droplet 302 on the substrate 111 by switching the drive waveform in accordance with discharge spacing has completed. FIG. 3B illustrates a flowchart of the present embodiment.

FIG. 3A illustrates an overview of the discharge unit 105 is coating the resin 114 onto the substrate 111 which is held by the substrate stage 104. Nozzles 301 is provided in the discharge unit 105, and the nozzles 301 discharges and coats the resin 114 onto the substrate 111 as the droplet 302. Note that, in the present embodiment, description is given for an example of four nozzles 301A, 301B, 301C, and 301D as the nozzles 301, but there is no limitation to this configuration, and the number of nozzles may be less than four or greater than four. In addition, no limitation is made for the arrangement of each nozzle.

The discharge unit 105 is connected to the control unit 106. The control unit 106 is a computer (an information processing apparatus) as described above, and controls discharge by the discharge unit 105. The control unit 106 is provided with the library (not shown) as a storage unit, and records information of an optimal drive waveform in accordance with a discharge spacing. Note that, in the present embodiment, illustration is given of a configuration in which the discharge unit 105 and the control unit 106 are directly connected, but the connection may be made through a relay substrate (not shown) as part of the control unit 106. A means for supplying a voltage to the piezoelectric element and the library which are described above is provided in the relay substrate.

Using FIG. 3B illustration is given of a process of the present embodiment with respect to the nozzles 301. While the substrate stage 104 (the substrate 111) is moving in the direction of the arrow symbol illustrated in FIG. 3A, the discharge unit 105 performs a discharge in a stationary state. The pattern of the droplets 302 is configured by discharge or non-discharge at the 16 discharge timings illustrated in FIG. 3A (T1 through T16). In other words, discharge is performed by a scan through the section of T1 through T16, and in the present embodiment this section is set as one shot. Note that, in the present embodiment, the discharge unit 105 is described as being in a stationary state, but discharging may be performed by a bi-directional scan in which it moves similarly to the substrate stage 104. Note that description is made here by giving the nozzle 301A on its own as an example, because a method of applying the invention to other nozzles 301B to 301D is the same.

In step S301, the control unit 106 measure the discharge speed and the discharge amount by changing the discharge spacing of the nozzles 301, obtains an appropriate drive waveform, and records it in the library. It is assumed that this process is not performed during a discharge process by the imprint apparatus 101, but is executed before performing a discharge process, and appropriate drive waveforms are recorded in advance. The discharge spacing is understood as a value used in advance to identify an amount of time from a drop recipe that is specified based on design data of a substrate. In addition, the discharge speed and the discharge amount are measured by using an external measurement device, for example a discharge observation apparatus or the like. In adjustment of a voltage component, the discharge amount and the discharge speed change by a respective constant change rate. In a case where deviation in a ratio between the discharge amount and the discharge speed has occurred due to influence of remaining vibration, it is possible to finely adjust the ratio between the discharge amount and the discharge speed by causing the ratio between the pull component and the push component of a waveform to change. As stated above, a plurality of drive waveforms for one nozzle is required.

In this fashion, by recording a plurality of drive waveforms that are used in a discharge process in a library in advance, it is possible to switch the drive waveform in a short amount of time by just switching a reference for a drive waveform (a reference destination in the library) without performing a calculation at a time of switching a waveform in one shot. As information stored in the library, information of a discharge spacing and corresponding drive waveforms is the minimum information, and it is desirably to additionally record information of a discharge speed and a discharge amount at a time of adjustment. By recording the discharge speed and the discharge amount, it is possible to effectively use this information when a separate correction has become necessary.

In step S302, the control unit 106 performs an initial setting, which is applied before starting the discharge process, specifically to the nozzle 301A. In the nozzle 301A according to the present embodiment, it is assumed that the discharge spacing is divided into three stages. In other words these are a first discharge spacing for T1 through T3, a second discharge spacing for T3 through T7, and a third discharge spacing for T7 through T16. The first discharge spacing is discharging for each lattice point illustrated in FIG. 3A. The second discharging is discharging with a space of one lattice point, and the discharge spacing is twice that of the first discharge spacing. The third discharging is discharging with a space of two lattice points, and the discharge spacing is three times that of the first discharge spacing. This discharge spacing can be specified in advance in accordance with a pattern to be formed on the substrate 111 (a coating pattern). Drive waveforms stored in the library in step S301 are a plurality of drive waveforms that are respectively optimal in the first through third discharge spacings. In step S302, as the initial setting, setting is performed so as to reference the library for the drive waveform adjusted by the first discharge waveform.

In step S303, the control unit 106 switches the reference of the library to the optimal drive waveform for the second discharge spacing of the nozzle 301A. This operation is performed at a stage where the discharge unit 105 has finished discharge for T3. It is assumed that the operations for step S302 through step S303 are performed consecutively, and discharge is by a series of scans.

In step S304, the control unit 106 switches the reference of the library to the optimal drive waveform for the third discharge spacing of the nozzle 301A. This operation is performed at a stage where the discharge unit 105 has finished discharge for T7. It is assumed that the operations for step S303 through step S304 are performed consecutively, and discharge is by a series of scans.

In this way, when the discharge spacing switches in one shot, by storing a plurality of optimal drive waveforms in a library in advance, switching to an optimal drive waveform at the same time as a switch of the discharge spacing is possible.

Note that, when transitioning to the next shot, a discharge process that corresponds to the next shot is performed. If there is no need to change the discharge process step S302 through step S304 illustrated in FIG. 3B repeat, and switching is performed if necessary. Because the discharge process is decided in accordance with the drop recipe, a plan is created in advance and stored in the library of the control unit 106.

The drive waveform described in the present embodiment is optimal when the discharge spacing is changed for the nozzle 301A, and optimal drive waveforms for each of the nozzles 301B to 301D are not necessarily the same. Accordingly, to increase precision of the discharge speed and the discharge amount, it is necessary to prepare a plurality of optimal drive waveforms for each discharge spacing for each nozzle. Accordingly, it is desirable to store in the library a plurality of drive waveforms for discharge spacings that can be set for each of the nozzles 301 provided in the discharge unit 105.

Although description is made by giving an example of three types (three patterns) of discharge spacing, there is no limitation to this, and the number of discharge spacings changed to in one shot is not limited. Accordingly, configuration may be taken such that a change of the discharge spacing is performed in accordance with a pattern for the discharge spacing.

In addition, in the example illustrated in FIG. 3A, the first through third discharge spacings change in one direction from dense to sparse. However, the discharge spacing may be set so that dense discharging is performed after a change from dense to sparse, and may be the reverse of this, for example.

Note that in the case of a long discharge spacing where the influence of remaining vibration tends not to appear, fluctuation of the discharge speed and the discharge amount is low. Accordingly, there is no need to switch the drive waveform for switching of the discharge spacing where it is determined that influence of a change at an adjustment time will not be produced, and by performing a change for a time of setting a discharge spacing for which influence of a change will be produced, it is possible to reduce a number of drive waveforms to be registered in the library. For determination here of whether to perform a switch, configuration may be taken to define a threshold value with respect to a discharge spacing in advance, and make a decision in accordance with a comparison with this threshold value, for example.

[Method of Manufacturing an Article]

A method of manufacturing a device such as a semiconductor integrated circuit element and liquid crystal display element as the article includes processes for using the imprint apparatus described above to form a pattern on a substrate such as a glass plate or a film substrate. Furthermore, this manufacturing method can include a process for etching the substrate on which the pattern is formed. Note that, in a case of manufacturing another article such as patterned media or an optical element, the manufacturing method can include other processing instead of etching to modify the substrate on which the pattern is formed. The method of manufacturing an article of the present embodiment is advantageous in at least one of capabilities, quality, productivity, and manufacturing cost for the article in comparison to a conventional method.

Description is given above regarding advantageous embodiments for the present invention, but the present invention is not limited to these embodiments, and various variations or changes are possible within the scope of the spirit thereof.

Embodiment(s) of the present invention can also be realized by a computer of a system or apparatus that reads out and executes computer executable instructions (e.g., one or more programs) recorded on a storage medium (which may also be referred to more fully as 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-092563, filed May 8, 2017, which is hereby incorporated by reference herein in its entirety.

What is claimed is:

1. An imprint apparatus, comprising:
a discharge unit in which a plurality of nozzles that discharge a liquid onto a substrate are arranged along a first direction;
a plurality of elements that are provided for the plurality of nozzles and control to discharge the liquid from each of the plurality of nozzles;
a storage unit configured to store a plurality of drive waveforms applied to the plurality of elements when driving the plurality of elements;
a moving unit for moving the substrate in a second direction that intersects the first direction; and
a selection unit configured to select, from among the plurality of drive waveforms stored in the storage unit, a drive waveform corresponding to a discharge spacing of each of the plurality of nozzles in the second direction when the liquid is discharged from each of the plurality of nozzles with moving the substrate by the moving unit.

2. The imprint apparatus according to claim 1, wherein the plurality of drive waveforms are provided for each of the plurality of nozzles.

3. The imprint apparatus according to claim 1, wherein the plurality of elements are piezoelectric elements.

4. The imprint apparatus according to claim 1, wherein a drive waveform is switched when the discharge spacing changes.

5. The imprint apparatus according to claim 1, wherein the plurality of drive waveforms are adjusted by measuring a discharge speed and a discharge amount in accordance with the discharge unit before formation of a pattern to be formed on the substrate starts.

6. A method of controlling an imprint apparatus provided with a discharge unit in which a plurality of nozzles that discharge a liquid onto a substrate are arranged along a first direction, a plurality of elements that are provided for the plurality of nozzles and control to discharge the liquid from each of the plurality of nozzles, a storage unit configured to store a plurality of drive waveforms applied to the plurality of elements when driving the plurality of elements, and a moving unit for moving the substrate in a second direction that intersects the first direction, the method comprising:
selecting, from among the plurality of drive waveforms stored in the storage unit, a drive waveform corresponding to a discharge spacing of each of the plurality of nozzles in the second direction when the liquid is discharged from each of the plurality of nozzles with moving the substrate by the moving unit.

7. The method according to claim 6, wherein the plurality of drive waveforms are provided for each of the plurality of nozzles.

8. The method according to claim 6, wherein the plurality of elements are piezoelectric elements.

9. The method according to claim 6, wherein a drive waveform is switched when the discharge spacing changes.

10. The method according to claim 6, wherein the plurality of drive waveforms are adjusted by measuring a discharge speed and a discharge amount in accordance with the discharge unit before formation of the pattern to be formed on the substrate starts.

* * * * *